United States Patent
Wang et al.

(10) Patent No.: US 9,368,486 B2
(45) Date of Patent: Jun. 14, 2016

(54) DIRECT CONNECTED SILICON CONTROLLED RECTIFIER (SCR) HAVING INTERNAL TRIGGER

(71) Applicant: Allegro Microsystems, LLC, Worcester, MA (US)

(72) Inventors: Zhixin Wang, Austin, TX (US); Juin Jei Liou, Oviedo, FL (US); Ruei-Cheng Sun, Tainan (TW)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/621,766

(22) Filed: Feb. 13, 2015

(65) Prior Publication Data

US 2015/0236011 A1    Aug. 20, 2015

Related U.S. Application Data

(60) Provisional application No. 61/940,586, filed on Feb. 17, 2014.

(51) Int. Cl.
*H01L 29/66* (2006.01)
*H01L 27/02* (2006.01)

(52) U.S. Cl.
CPC .................................. *H01L 27/0262* (2013.01)

(58) Field of Classification Search
CPC ...................................................... H01L 27/0262
USPC ............................................ 257/107, 173–175
See application file for complete search history.

(56) References Cited

U.S. PATENT DOCUMENTS

| | | | |
|---|---|---|---|
| 5,465,189 A | 11/1995 | Polgreen et al. | |
| 5,856,214 A | 1/1999 | Yu | |
| 6,081,002 A | 6/2000 | Amerasekera et al. | |
| 2007/0090392 A1* | 4/2007 | Boselli | H01L 27/0262 257/107 |

OTHER PUBLICATIONS

Notice of Allowance dated Feb. 16, 2016 for U.S. Appl. No. 14/847,519; 9 Pages.
Second Notice of Allowance dated Mar. 9, 2016 corresponding to U.S. Appl. No. 14/847,519; 6 Pages.
U.S. Appl. No. 14/847,519, filed Sep. 8, 2015, Wang et al.

* cited by examiner

*Primary Examiner* — Thanh T Nguyen
(74) *Attorney, Agent, or Firm* — Daly, Crowley, Mofford & Durkee, LLP

(57) ABSTRACT

In one aspect, a direct connected silicon control rectifier (DCSCR) includes a substrate having a semiconductor surface, a parasitic PNP bipolar transistor and a parasitic NPN bipolar transistor formed in the semiconductor surface. The parasitic PNP bipolar transistor includes a p+ emitter, an nbase and a pcollector and the parasitic NPN bipolar includes an n+ emitter, a pbase and an ncollector. The DCSCR also includes an electrically conductive line connecting an n+ contact to the nbase to a p+ contact to the pbase so that the nbase and the pbase are shorted.

11 Claims, 20 Drawing Sheets

DIRECT CONNECTED SILICON CONTROLLED RECTIFIER (SCR) HAVING INTERNAL TRIGGER

RELATED APPLICATIONS

This application claims the benefit of U.S. Provisional Application No. 61/940,586 filed Feb. 17, 2014, and entitled "DIRECT CONNECTED SILICON CONTROLLED RECTIFIER (SCR) HAVING INTERNAL TRIGGER," which is incorporated herein by reference in its entirety.

FIELD

Disclosed embodiments relate to silicon controlled rectifiers (SCRs).

BACKGROUND

Electrostatic Discharge (ESD) induced failure is a major concern for the Metal-Oxide-Semiconductor (MOS) transistor-based integrated circuits (ICs) in main-stream technologies. This reliability issue is further worsened in advanced technology including submicron Complementary-Metal-Oxide-Semiconductor (CMOS) with very low operation voltage (such as an operating voltage <5V) and Bipolar-CMOS-DMOS (BCD) for high voltage applications. There has been a growing demand for the availability of robust ESD protection solutions for advanced and main-stream technologies that are capable of operating in a very narrow ESD design window. A Silicon Controlled Rectifier (SCR) is a common device used for ESD protection.

A typical on-chip ESD protection scheme for an I/O port (generally accessible at a bond pad on the IC die) involves including an SCR device referred to as an ESD clamp hooked in parallel to the internal circuitry to be protected between the input/output (I/O) pad which interfaces to both the outside world and ground (GND). When an ESD event (e.g., a high power pulse) occurs at the I/O port, the ESD clamp turns on and once on provides a parallel low resistance conduction path that shunts the ESD-induced current (and thus the power) to GND, and thus away from the internal circuitry being protected.

FIG. 1A shows a cross-section view of a conventional SCR 100 and FIG. 1B the equivalent circuit of the conventional SCR 100. SCR 100 includes a parasitic PNP bipolar transistor 110 including an nwell 111 as its nbase and a parasitic NPN bipolar transistor 120 including a pwell 121 as its pbase, where the (C) collector of each transistor is coupled to the base (B) of the other transistor.

SCR 100 is a 4 terminal device having 4 surface terminals formed on a substrate 102 shown having a semiconductor p-type surface (p-sub) 105. Typical doping concentrations in p-sub 105 are $1\times10^{15}$ cm$^{-3}$, in nwell 111 from $1\times10^{17}$ to $1\times10^{18}$ cm$^{-3}$, and in pwell 121 from $1\times10^{17}$ to $1\times10^{18}$ cm$^{-3}$. Typical junction depths for nwell 111 and pwell 121 are 1 µm to 1.5 µm.

The terminals of SCR 100 are identified as "anode gate" (AG) 112/N+ region formed at the surface of the nwell 111, "anode"/P+ region 113 formed at the surface of the nwell 111 lateral to the AG 112, "cathode gate" (CG)/P+ region 122 formed at the surface of the pwell 121, and "cathode"/N+ 123 formed at the surface of the pwell 121 lateral to CG 122. In SCR 100, the AG 112 and anode 113 in the nwell 111 are both seen to be connected to I/O PAD (PAD, the PAD to be ESD protected), while the cathode 123 and CG 122 in the pwell 121 are both seen connected to GROUND (GND). Thus, in conventional SCR 100, the AG 112 and anode 113 are tied together and connected to the I/O PAD, while CG 122 and the cathode 123 are tied together and connected to GND.

Conventional SCR 100 and its variants use a triggering circuit outside the SCR region to turn on the SCR 100 which takes up area on the chip. Known SCRs generally have a relatively high trigger voltage and leakage current, and process snapback behavior, which make it hard to work in smaller ESD design windows. Moreover, conventional SCR 100 and its variants have a relatively slow turn-on speed which can prove fatal to some relatively EDS-sensitive internal circuitry in the case of a fast-rising ESD stress.

SUMMARY

Disclosed embodiments include an SCR design referred to herein as a Direct-Connected SCR (hereafter DCSCR), which is configured to use its internal diodes as an internal trigger to establish the triggering path, resulting in a very low trigger voltage (equal to two times of the turn-on voltage of a single diode). Another benefit from disclosed internal triggers is efficient chip area consumption, because no extra trigger circuit is needed, disclosed DCSCRs use about the same semiconductor (e.g., silicon) area as a traditional SCR, such as SCR 100 shown in FIG. 1A discussed above.

After being triggered on, disclosed DCSCRs dominate the current discharge and provide high robustness. This low trigger voltage, together with the DCSCR's holding voltage generally in the range of about 1V to 3V, provides a snapback-free I-V curve for disclosed SCRs under the standard Transmission Line Pulse (TLP) stressing condition. Such attractive performance characteristics is demonstrated by measurements results from disclosed DCSCRs described below. Disclosed DCSCRs provide a useful, flexible and configurable apparatus for a variety of ESD protection solutions for both low and high voltage IC circuits.

DETAILED DESCRIPTION

Figure 1A:
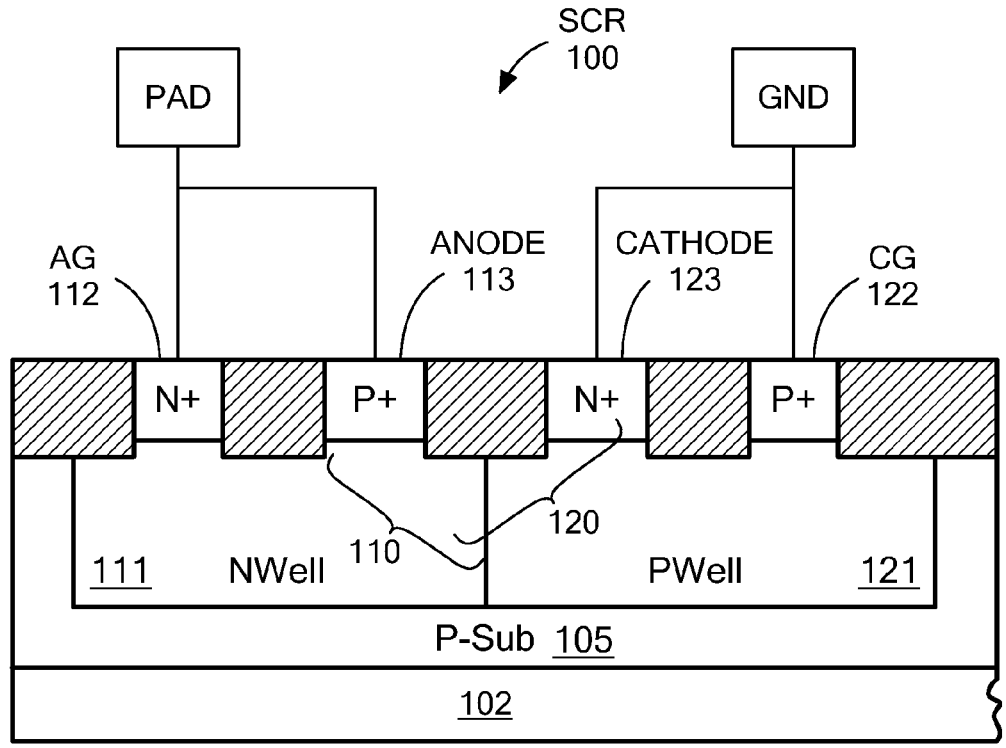
FIG. 1A shows a cross-section view of a conventional SCR and FIG. 1B shows the equivalent circuit of conventional SCR.
Figure 1B:
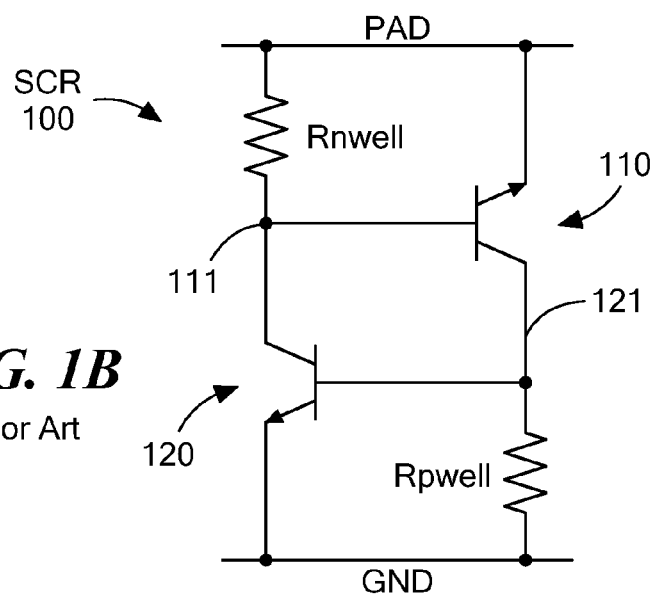

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described below with reference to example applications for illustration.

It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Figure 2A:
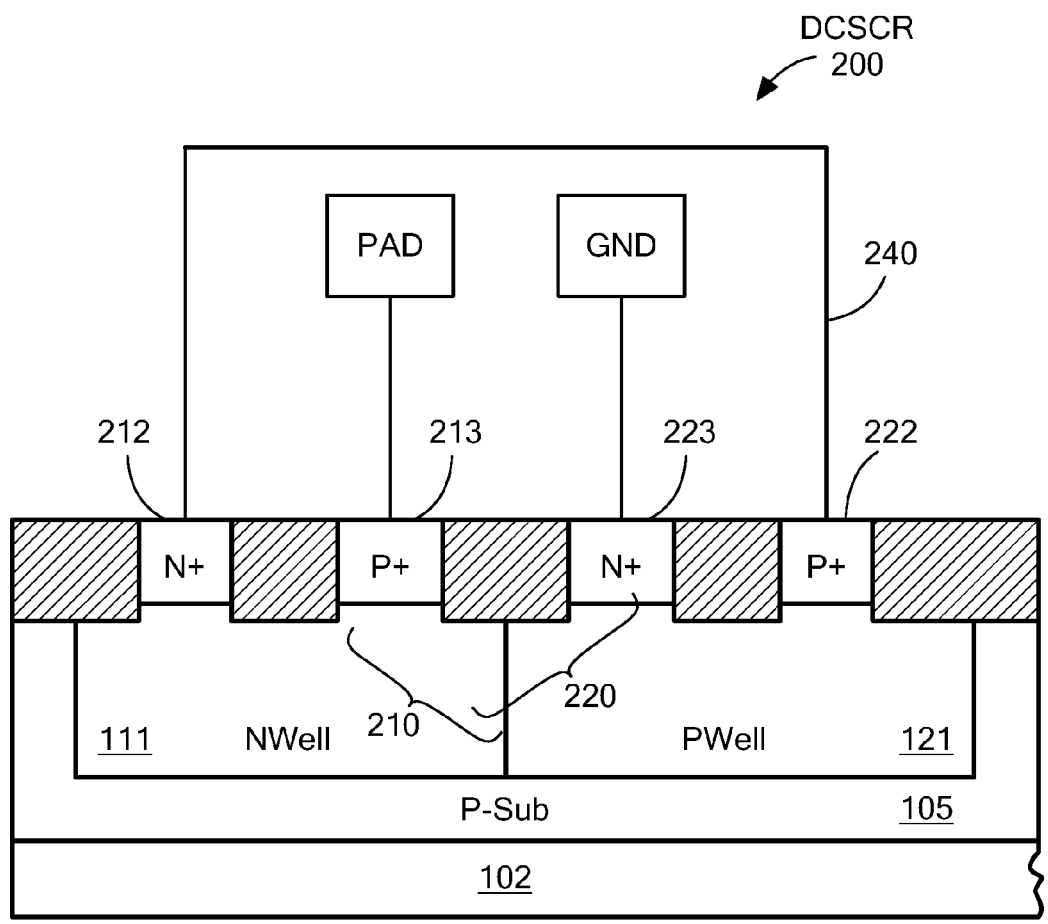
FIG. 2A show a cross-sectional view of an example DCSCR having dual wells (a pwell and an nwell), according to an example embodiment.
Figure 2B:
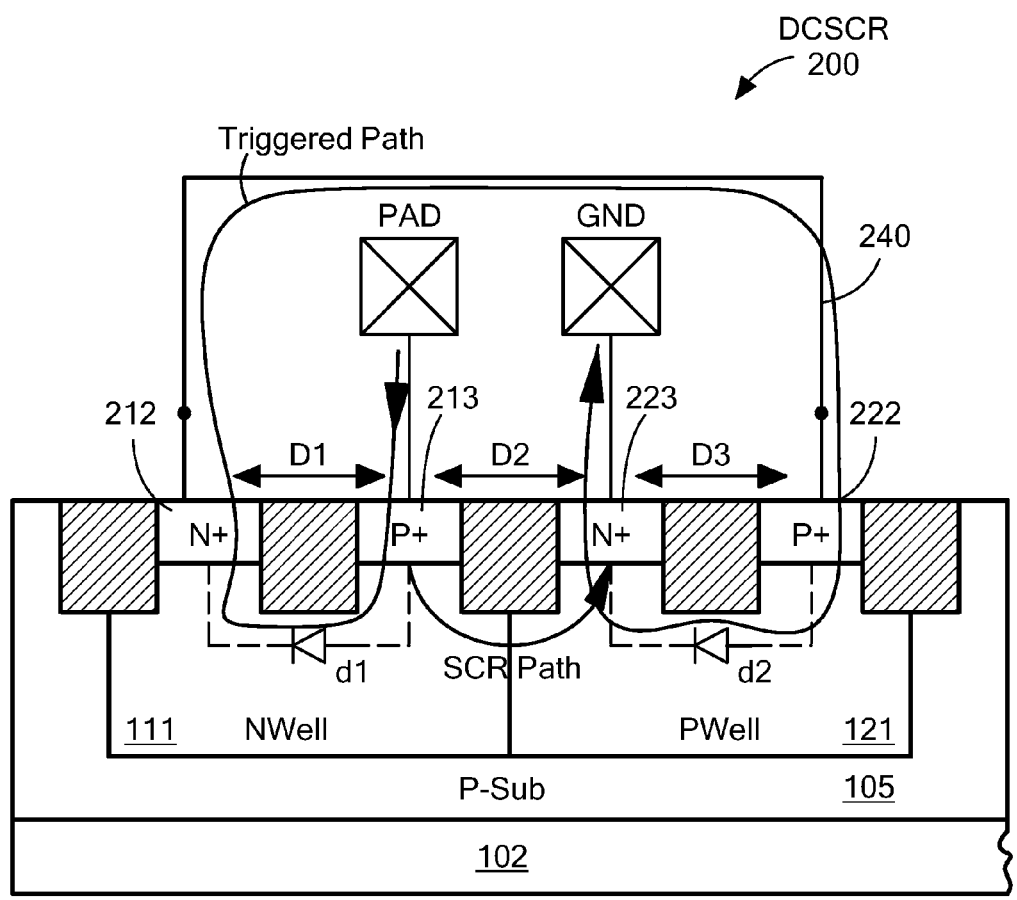
FIG. 2B shows a trigger scheme for the DCSCR shown in FIG. 2A including the triggered path.

FIG. 2A show a cross-sectional view of an example DCSCR 200 having dual wells, with a pwell and an nwell, according to an example embodiment. FIG. 2B shows the equivalent circuit for DCSCR 200 shown in FIG. 2A. DCSCR 200 can be realized on the chip along with other circuitry (analog or digital, or both analog and digital) in a variety of advanced and main-stream semiconductor technologies, but can also be a standalone (discrete) circuit.

As with conventional SCR 100, DCSCR 200 includes a parasitic PNP bipolar shown as 210 and a parasitic NPN bipolar shown as 220, where the (C) collector of each transistor is tied (common) with the base (B) of the other transistor. One new feature for DCSCR 200 is the anode 213 and anode gate 212 (contacting nbase 111 of the parasitic PNP transistor 210) are not tied together, and the cathode 223 and cathode gate 222 (contacting pbase 121 of the parasitic NPN transistor 220) are not tied together, as they both are tied together in the conventional SCR shown in FIG. 1A. Another new feature is the nbase 111 of parasitic PNP transistor 210 is connected to the pbase 121 of the parasitic NPN transistor 220 using an electrically conductive line (e.g., metal line, heavily doped (e.g., n+) polysilicon line, or other highly electrically conductive material available in the process), indicating that both bases 111 and 121 are essentially shorted together.

The emitters are shown as 213 for the parasitic PNP 210 and 223 for the parasitic NPN 220. The shadow shaded surface regions between the N+ and P+ regions (212, 213, 222, 223) represent a field dielectric for device isolation, such as field oxide isolation or trench isolation.

Figure 2C:
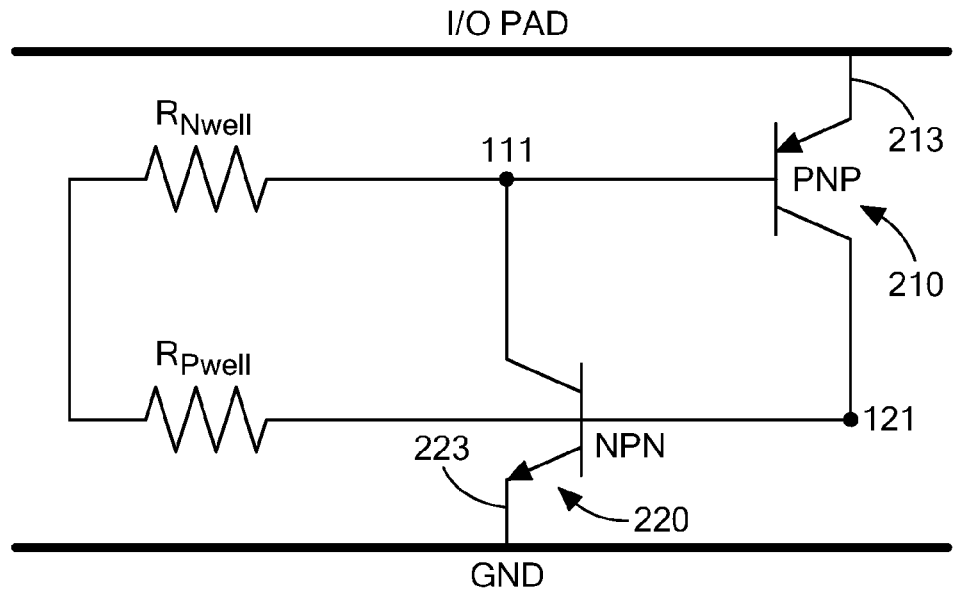
FIG. 2C shows the equivalent circuit for the DCSCR shown in FIG. 2A hooked between an I/O PAD and GND for protection circuitry on an IC coupled to the I/O PAD (not shown)

FIG. 2B shows a trigger scheme for DCSCR 200 and FIG. 2C its equivalent circuit hooked between and I/O PAD and GND. Advantages of disconnecting the nbase 111 of parasitic PNP transistor 210 and the pbase 121 of parasitic NPN transistor 220 from PAD and GND, respectively, and shorting them together, have been found to include reducing the trigger voltage in the SCR cell to about two times of the forward turn-on voltage of a single diode (about 1.3 v). DCSCR 200 also increases the SCR's turn-on speed since the parasitic NPN transistor 220 and parasitic PNP bipolar transistor 210 will be essentially simultaneously switched on. In the conventional SCR 100 in FIG. 1A, the device is triggered by an avalanche breakdown mechanism between the nwell 111/pwell 121 junction, which results in a relatively high trigger voltage (e.g., 15 to 40 V, depending largely on the doping level on the more lighter doped side of the junction. The turn-on speed for the conventional SCR 100 is also slower than DCSCR 200 since the parasitic NPN and PNP transistors are not simultaneously triggered.

With an optional added external trigger diode chain, the trigger voltage can be reduced and the turn-on speed can be increased, but at the expense of a larger chip area. In addition, such a traditional device still possesses a large snapback, as the holding voltage is significantly smaller than the trigger voltage.

Figure 3:
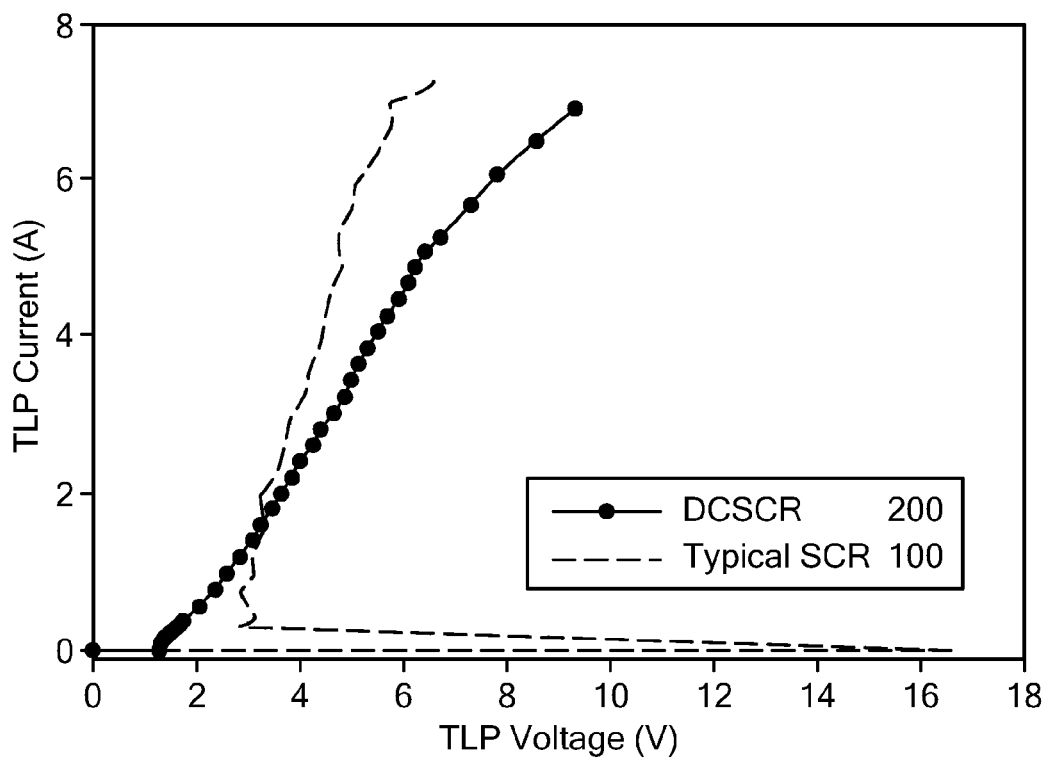
FIG. 3 shows measured TLP I-V curves for the conventional SCR shown in FIG. 1A and the disclosed DCSCR shown in FIG. 2A.

DCSCR 200 is suitable for ESD protection of I/O pins operating at a low voltage application, especially pins with an operation voltage lower than 1V. As such, disclosed embodiments promise a major improvement for ESD protection device solutions for next-generation low voltage technologies in the future. For operating voltages larger than 1V, the DCSCR 200 may be subject to an undesirable high leakage current. However, circuits are described below in FIGS. 12, 13, 14A-C, 15, 16, and 17A-C are designed to compress the leakage current, referred to herein as MOS-connected SCR (MCSCR). FIG. 3 shows the current-voltage characteristics of conventional SCR 100 and disclosed DCSCR 200 measured using the transmission line pulsing (TLP) tester. The pulse width used was 100 ns, with a Pulse rise time of 10 ns. Clearly, DCSCR 200 offers a comparatively very low trigger voltage (1.3V), snapback-free behavior, high ESD robustness, and faster turn-on speed as compared to conventional SCR 100.

Figure 4A:
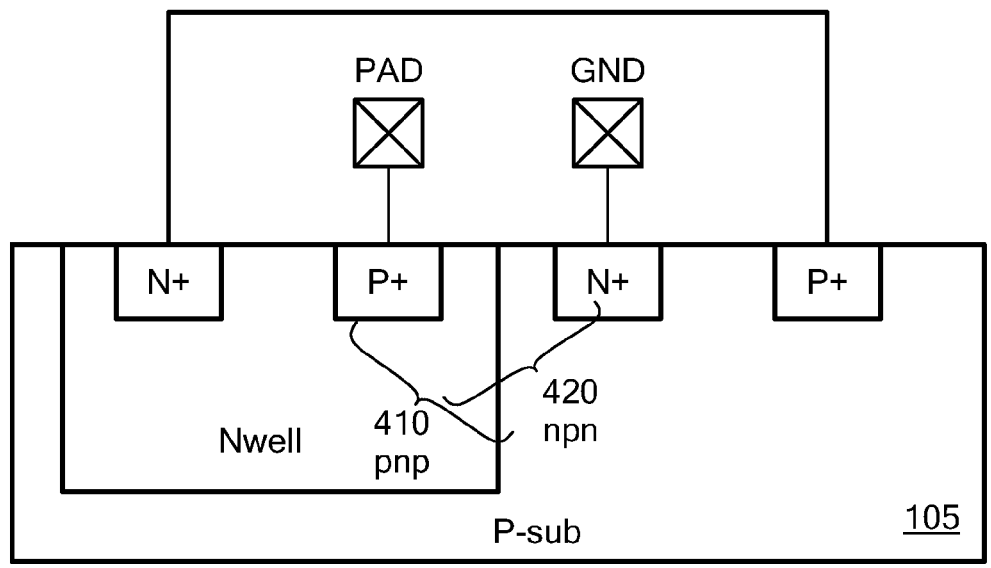
FIG. 4A is a single well DCSCR version not showing any dielectric isolation.

This Disclosure now discloses several different circuit variations. In between implantation (n+ or p+) there will generally be field oxide or trench isolation formation processing. In a single well version, shown as an nwell in a p-substrate, the DCSCR can be realized as shown in FIG. 4A which does not show an dielectric isolation. In FIG. 4A, the parasitic pnp is shown as 410, which utilizes the p-sub 105 as its collector, and the parasitic npn is shown as 420 which uses the p-sub 105 as its base. In this embodiment, the p-sub 105 is generally doped to at least $1\times10^{14}$ cm$^{-3}$, with a typical doping range of $1\times10^{14}$ to $1\times10^{15}$ cm$^{-3}$.

Figure 4B:
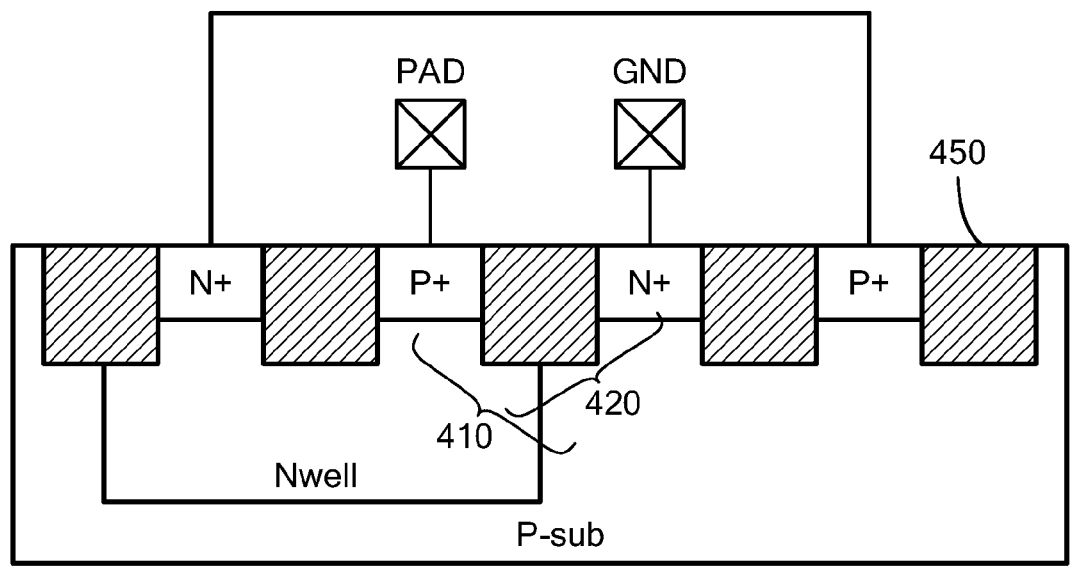
FIG. 4B is a version showing dielectric isolation between its terminals.
Figure 5:
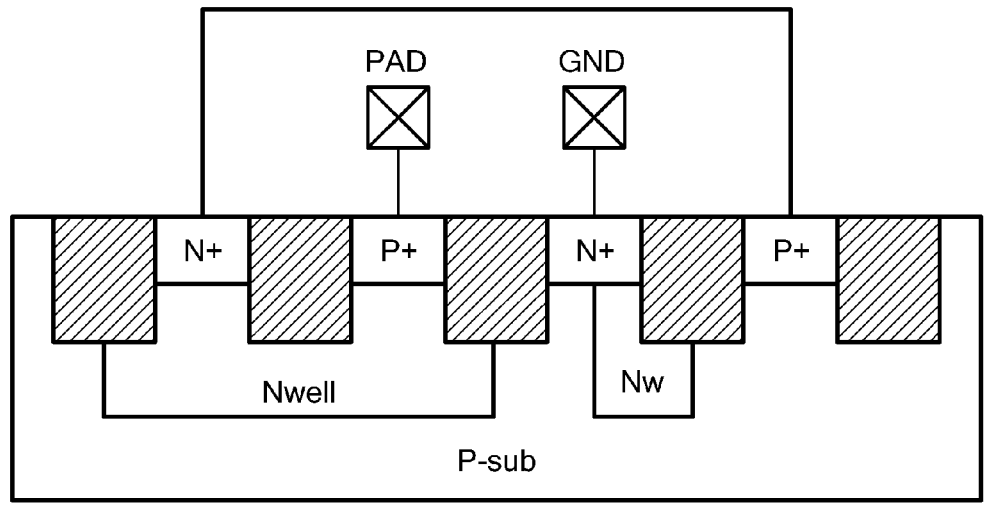
FIG. 5 shows a twin nwell DC SCR version.

FIG. 4B shows the DCSCR of FIG. 4A with added dielectric isolation 450. The single nwell version can add an extra nwell in the p-sub region to increase the pbase resistance in the triggering path. FIG. 5 shows a twin nwell version.

Figure 6A:
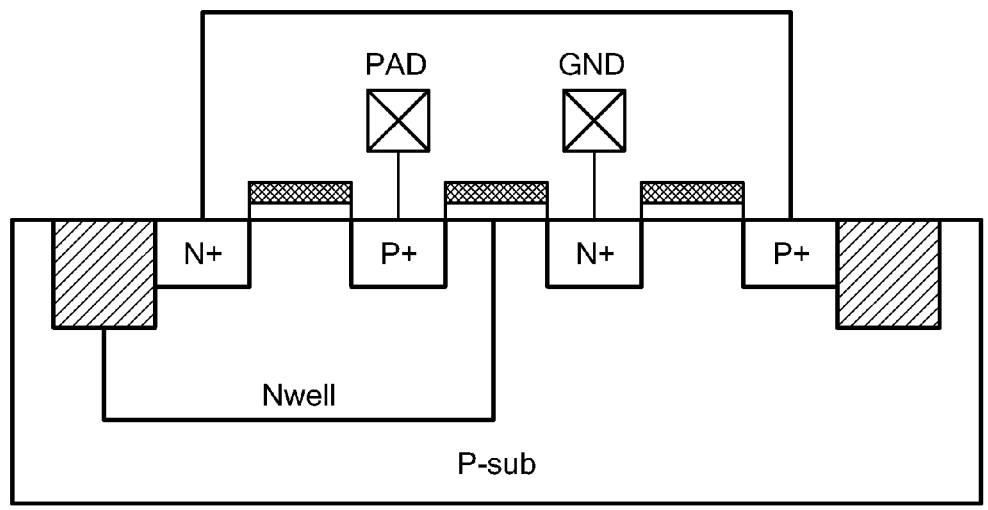
FIGS. 6A-C shows a dummy gate versions of disclosed DCSCRs with a single nwell with various isolation schemes.
Figure 6B:
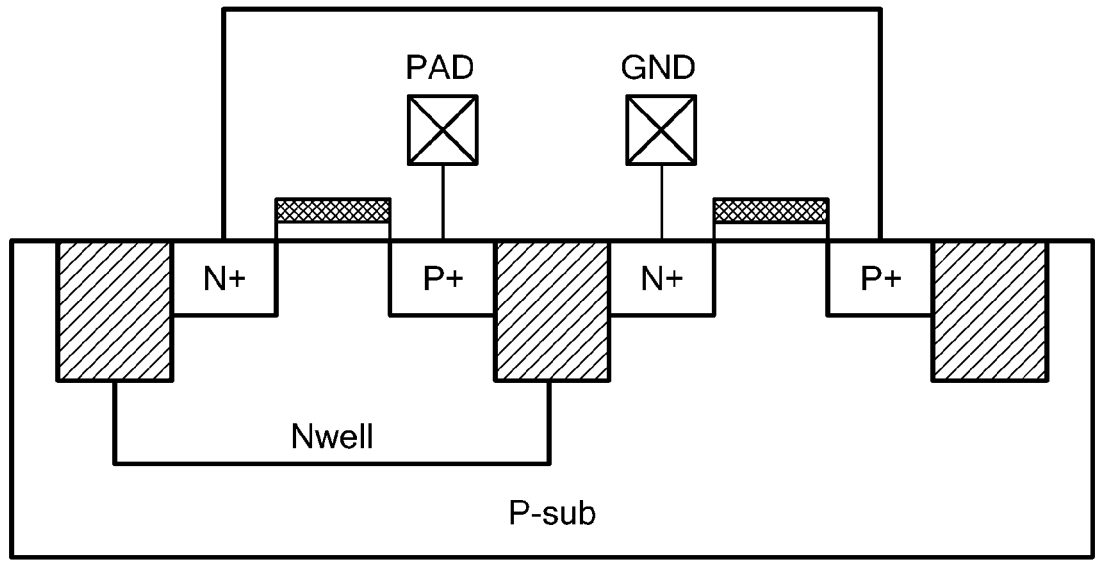
Figure 6C:
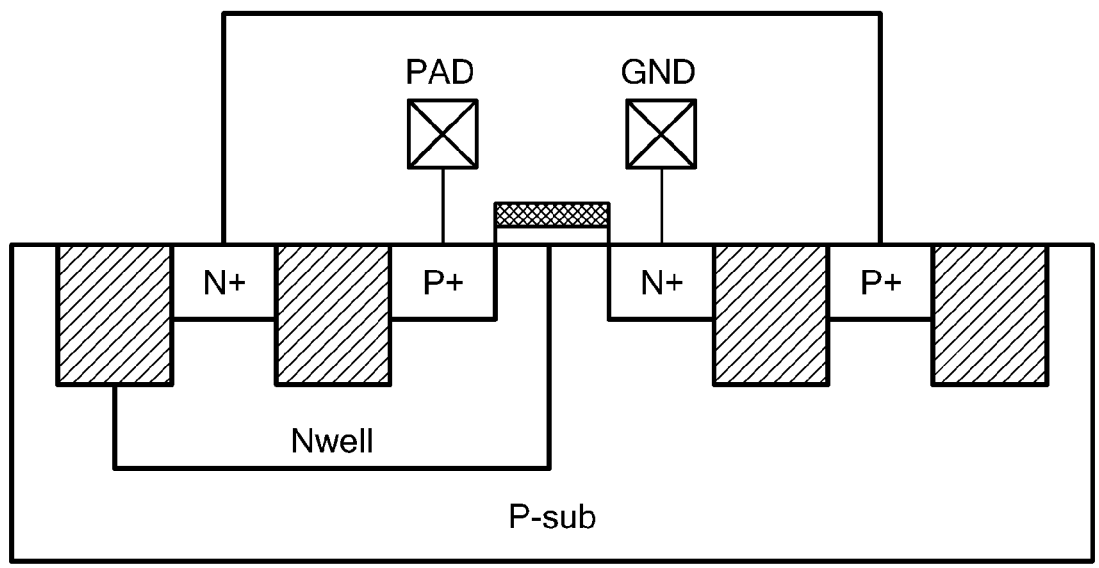

FIG. 6A-C shows a dummy gate versions of disclosed DCSCRs with a single nwell with various isolation schemes. In these dummy gate version, in operation, the dummy gate can be floating, biased to a constant voltage potential, or tied external trigger circuit. The dummy gate(s) themselves will not increase the turn on time. Instead, the dummy gate can block the formation of the field oxide or trench isolation formation. Therefore the current will flow close to surface, but not deep under the field oxide or trench isolation. In such technique the length that triggering current has to flow is reduced, and hence the turn-on time is also reduced. Dummy gates include a gate electrode on a gate dielectric, analogous to the gate stack in a MOS device.

Figure 7:
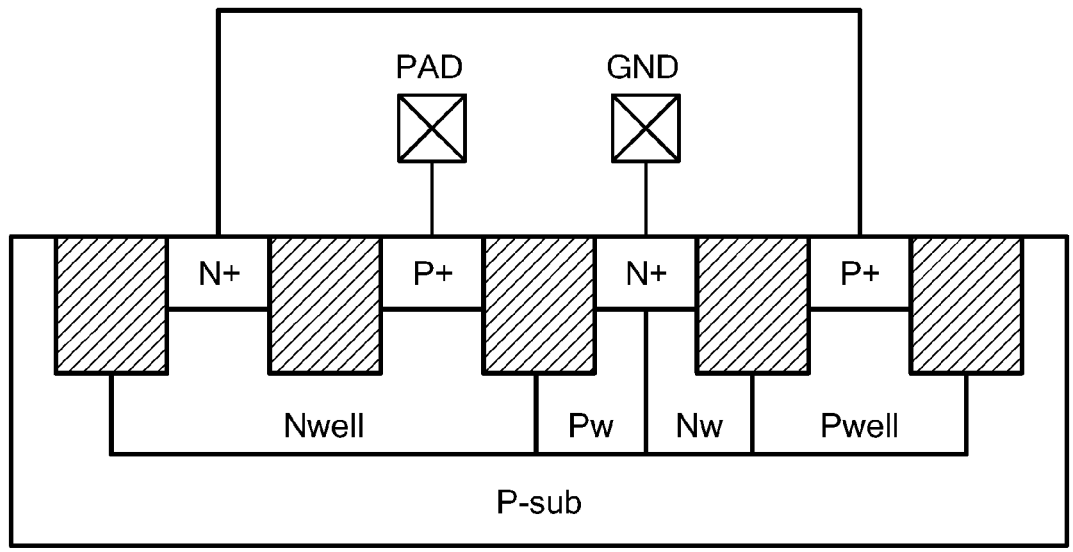
FIG. 7 shows a twin well DCSCR with an extra nwell (Nw) in the pwell and an extra pwell Pw in the nwell.
Figure 8A:
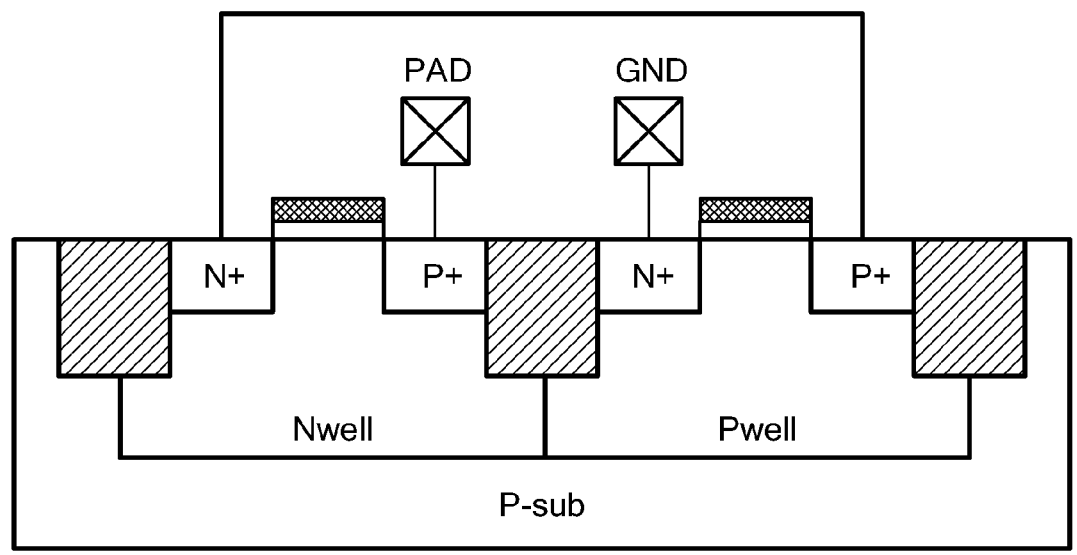
FIGS. 8A-C show dummy gate versions of a twin well DC SCR.
Figure 8B:
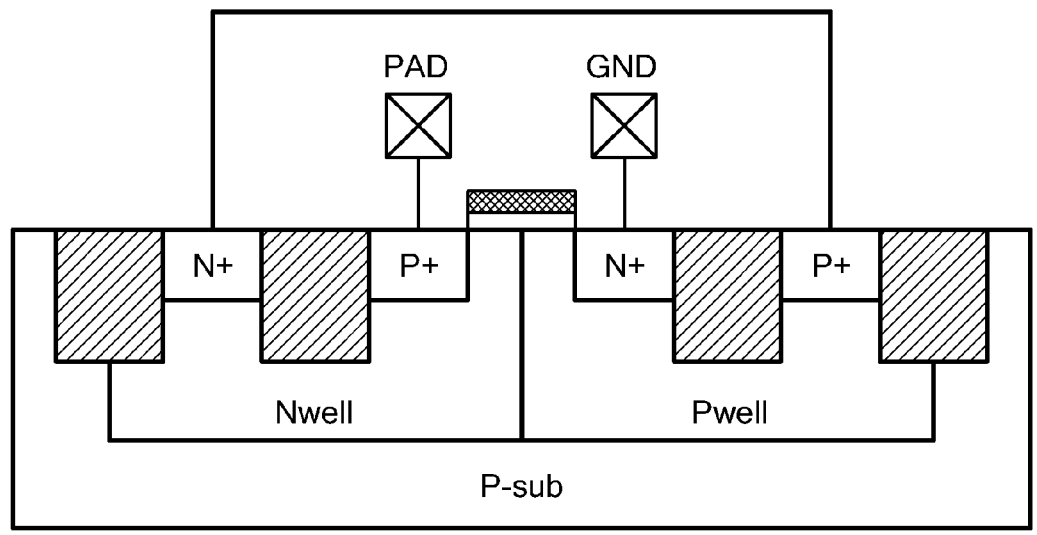
Figure 8C:
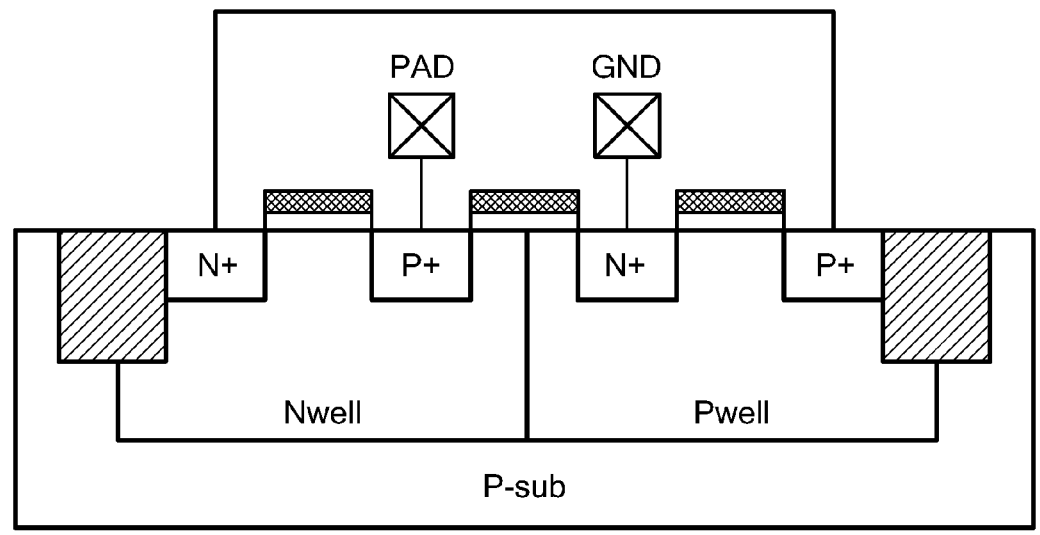

FIG. 7 shows a DCSCR with an extra nwell (Nw) in the pwell and an extra pwell (Pw) in the nwell. FIG. 8A-C show dummy gate versions of a twin well DCSCR with dielectric isolation. As noted above, in the dummy gate version, the gate can be floating, biased to a constant voltage potential, or tied to an external trigger circuit.

Figure 9A:
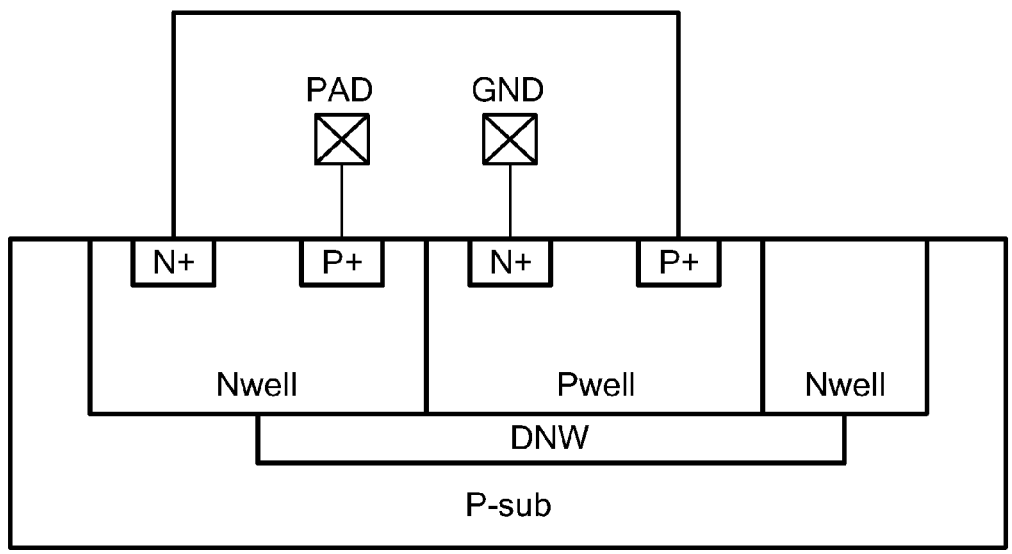
FIGS. 9A and 9B show a DCSCR realized in triple wells with FIG. 9B showing dielectric isolation. Each DCSCR also includes an additional deep nwell (DNW).
Figure 9B:
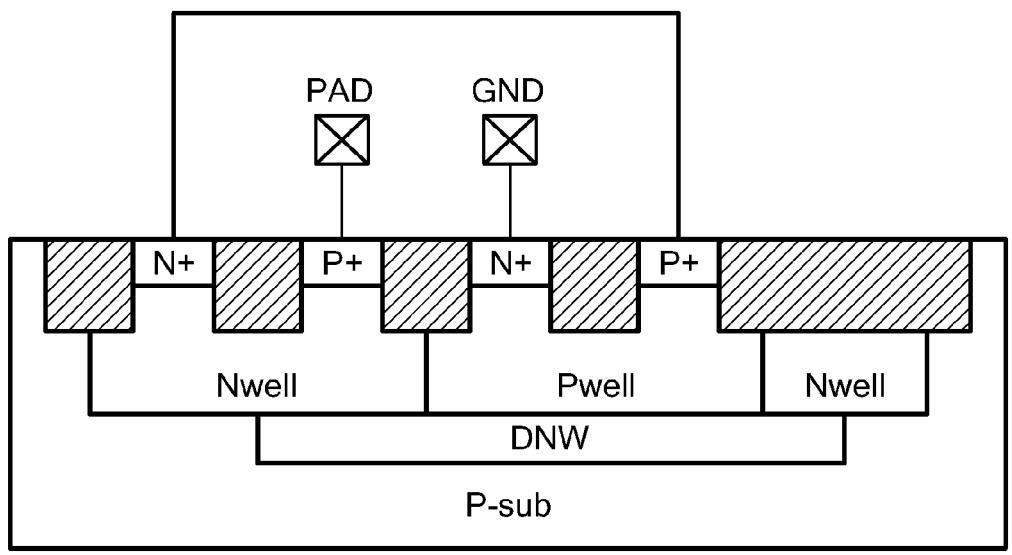

The DCSCR can be realized with triple wells as shown in FIGS. 9A and 9B along with an optional deep nwell (DNW). The DNW provides junction isolation between the PWell and the P-sub. FIG. 9B is shown including dielectric isolation.

Figure 10:
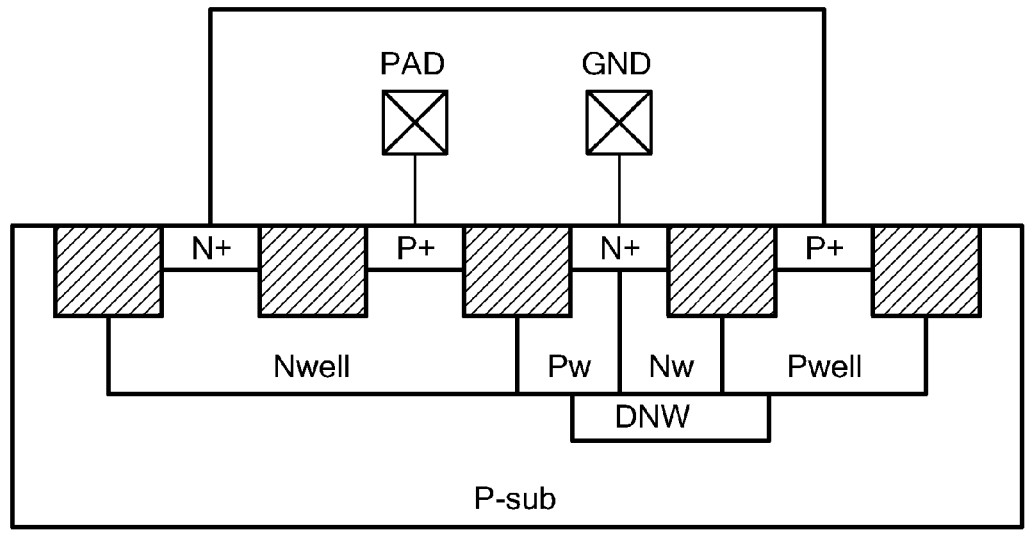
FIG. 10 shows a triple (three) well DCSCR including an additional deep nwell (DNW) centered on the second nwell (Nw).
Figure 11A:
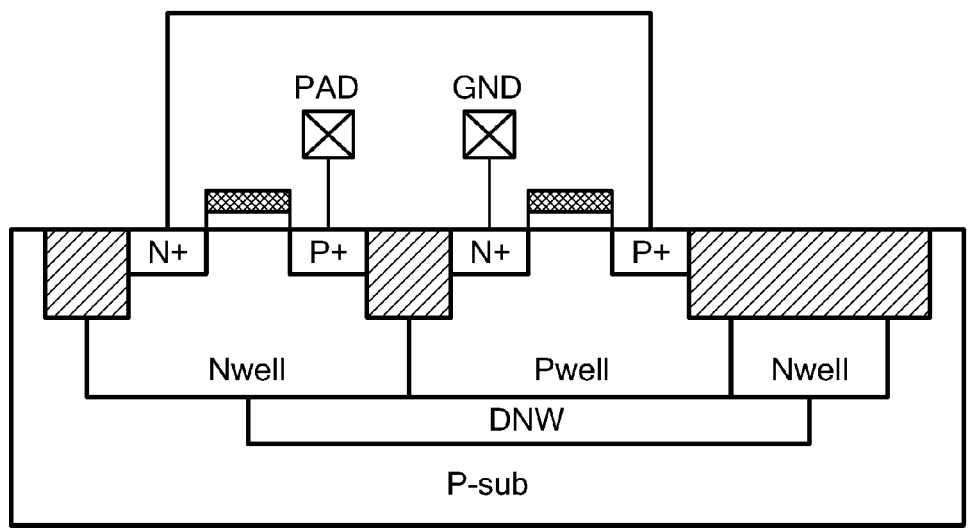
FIGS. 11A-C shows various dummy gate versions of the triple well DCSCR shown in FIG. 10.
Figure 11B:
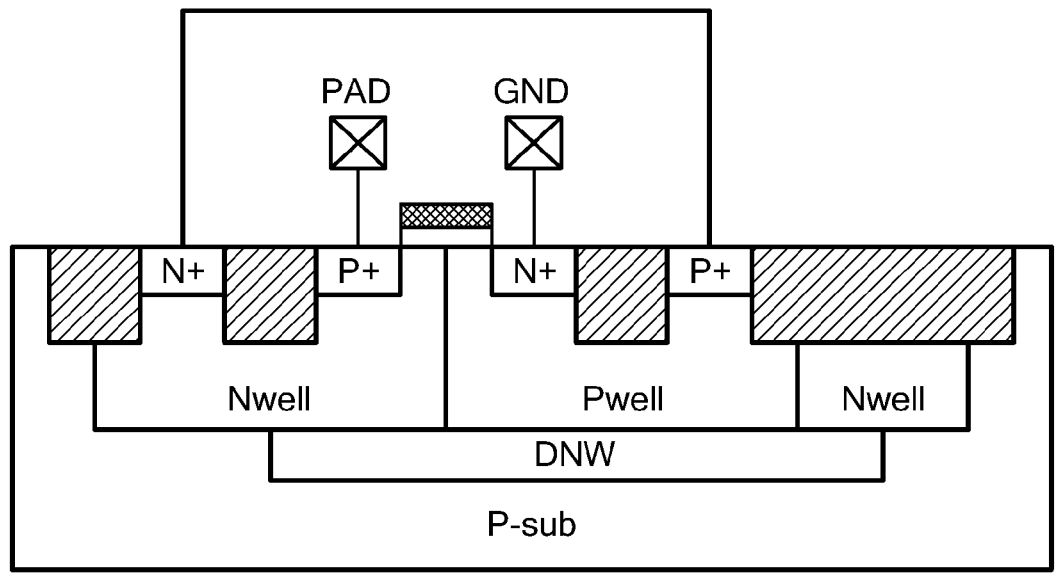
Figure 11C:
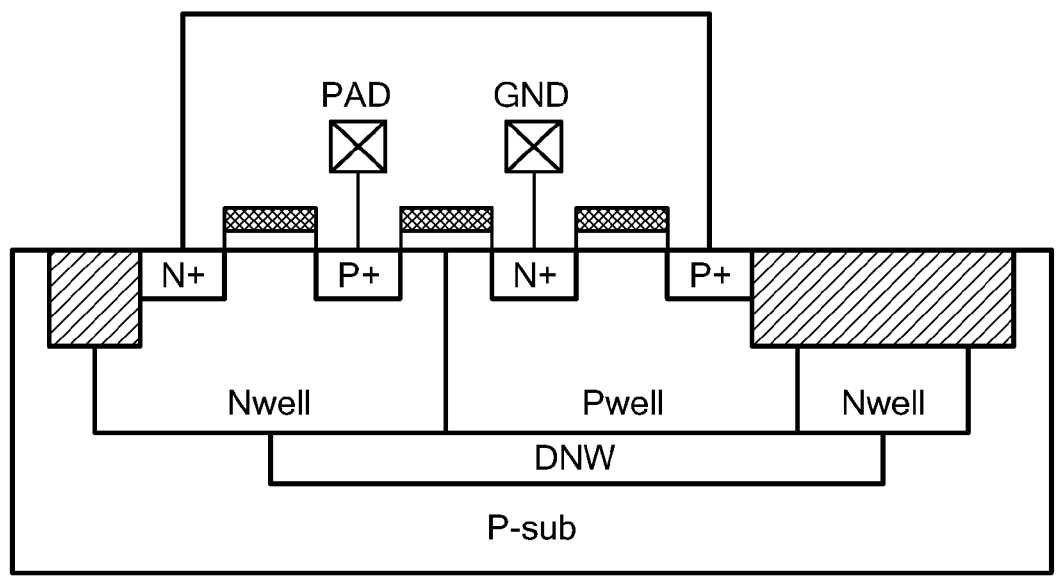

FIG. 10 shows a triple (three) well (NWell, PWell, and DNW) DCSCR including an additional deep nwell (DNW) centered on a second nwell (Nw). FIGS. 11A-C shows the dummy gate version of the triple well DCSCR. As noted above, in this dummy gate version, the gate electrode can be floating, biased to a constant voltage potential, or tied to an external trigger circuit.

Optional leakage current compression techniques are now disclosed. Disclosed are two different example ways to reduce the leakage current of the DCSCR. In the description below twin well technology is used as an example only for illustration. Disclosed leakage current compression techniques can be also applied to single well, triple well and other technologies.

Figure 12:
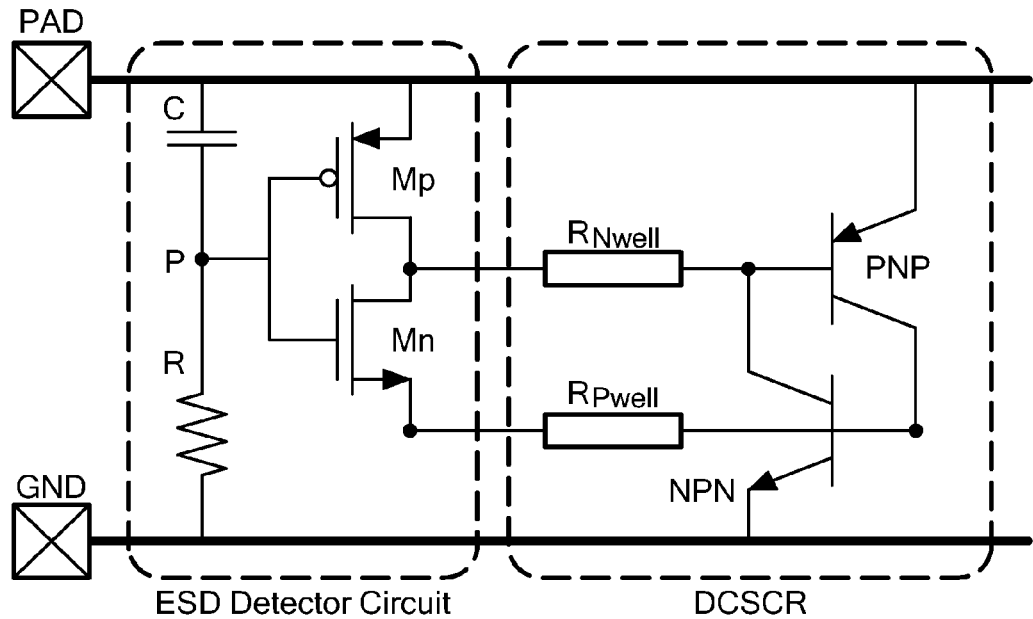
FIGS. 12 and 13 show a schematic and cross-section view, respectively, of Type I low-leakage, low-trigger voltage structure (shown as an ESD detector circuit) coupled to a disclosed DCSCR. The ESD Detector Circuit includes an RC network which is coupled to a CMOS inverter.
Figure 13:
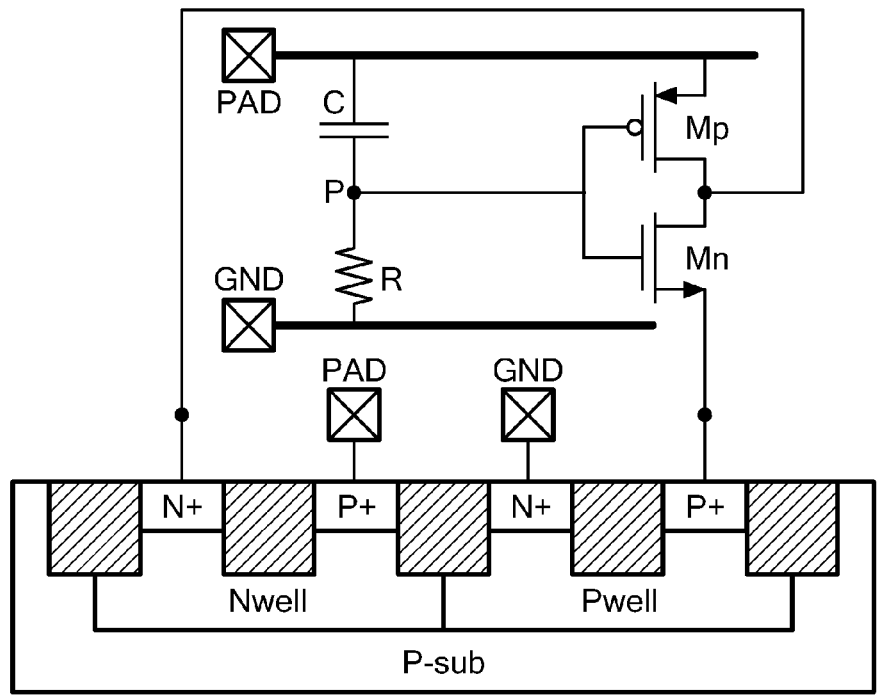
Figure 14A:
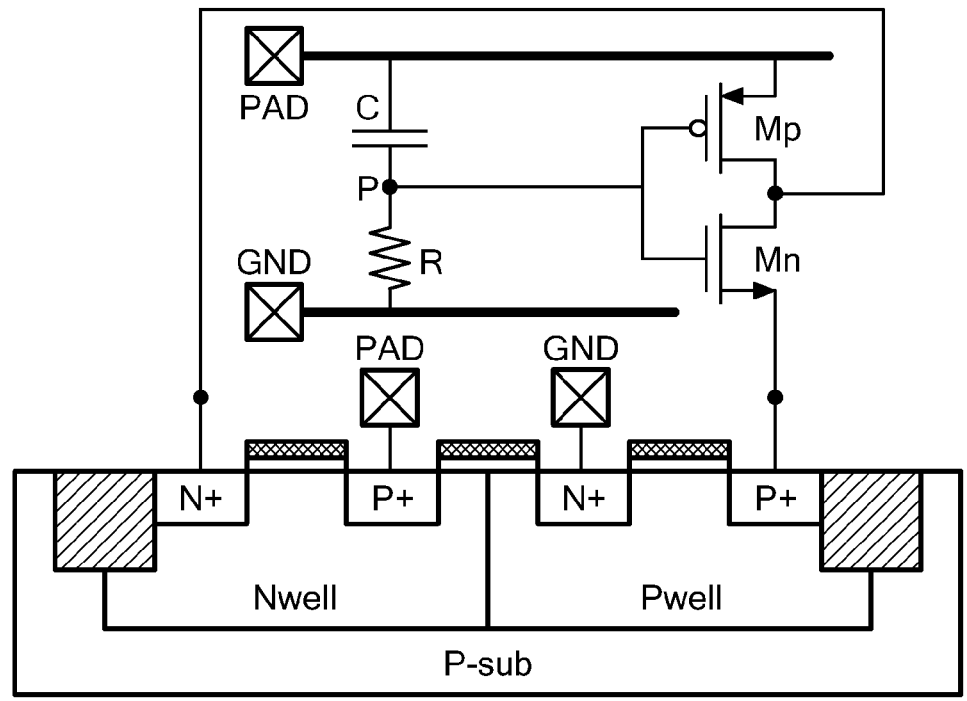
FIGS. 14A-C show a MOS-connected SCR (MCSCR) Type I ESD Detector Circuit coupled to various dummy gate versions of disclosed DCSCRS.
Figure 14B:
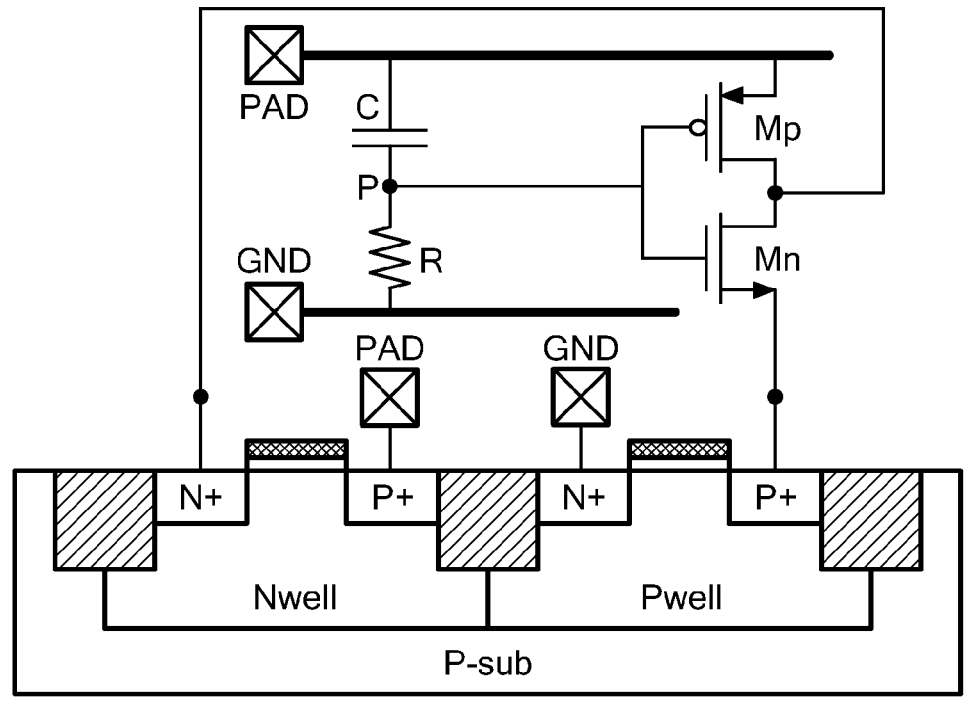
Figure 14C:
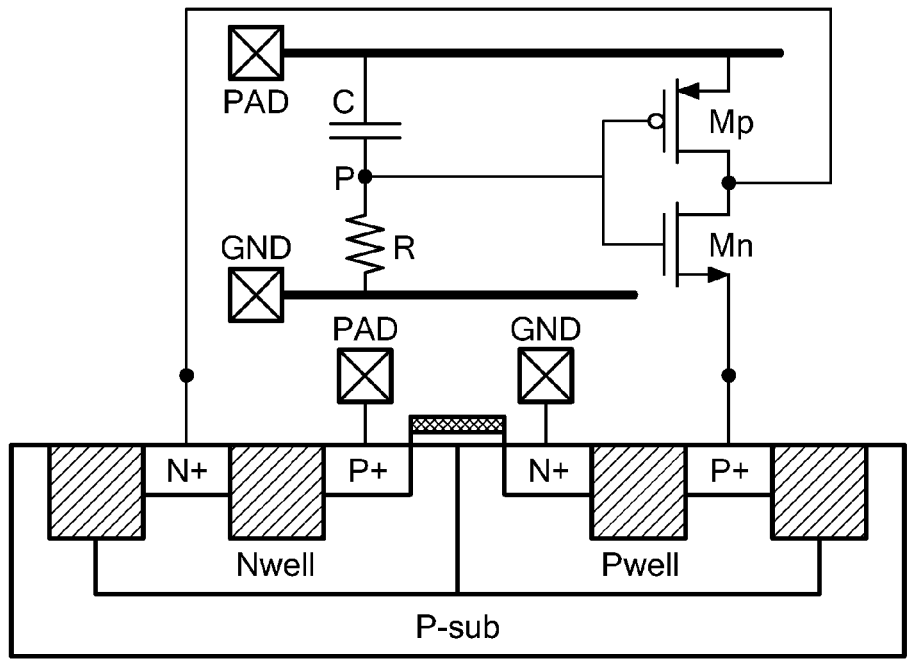

FIGS. 12 and 13 show the schematic and cross-section view, respectively, of Type I low-leakage, low-trigger voltage structure that includes an ESD detector circuit coupled to a disclosed DCSCR. The ESD detector circuit includes an RC network which is coupled to a CMOS inverter. Additional novel points of this implementation include the bases of parasitic PNP and NPN transistors are connected to the drain and source of NMOS respectively which is triggered on by RC network, and the NMOS is off during normal operation so that the leakage current will be limited. When the PAD is subject to an ESD event, the RC network will detect the ESD pulse and turn on the NMOS, which feeds the current into the DCSCR and switches it on. The capacitor shown can include a PIP capacitor, MIM capacitor, MOS capacitor, MOM capacitor, or others. FIGS. 14A-C show a MOS-connected SCR (MCSCR) Type I ESD detector circuit coupled to various twin well dummy gate DCSCR versions. Disclosed MCSCRs provide optional leakage reduction.

Figure 15:
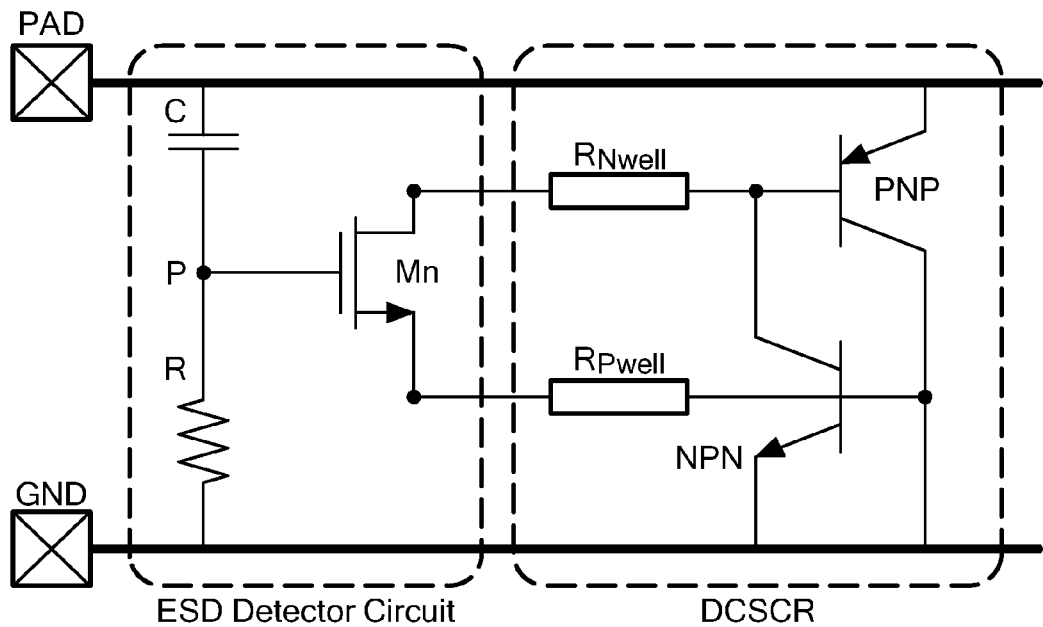
FIGS. 15 and 16 show the schematic and cross-section view, respectively, of Type II low-leakage and low trigger voltage structure (MCSCR Type II) coupled to a disclosed DCSCR.
Figure 16:
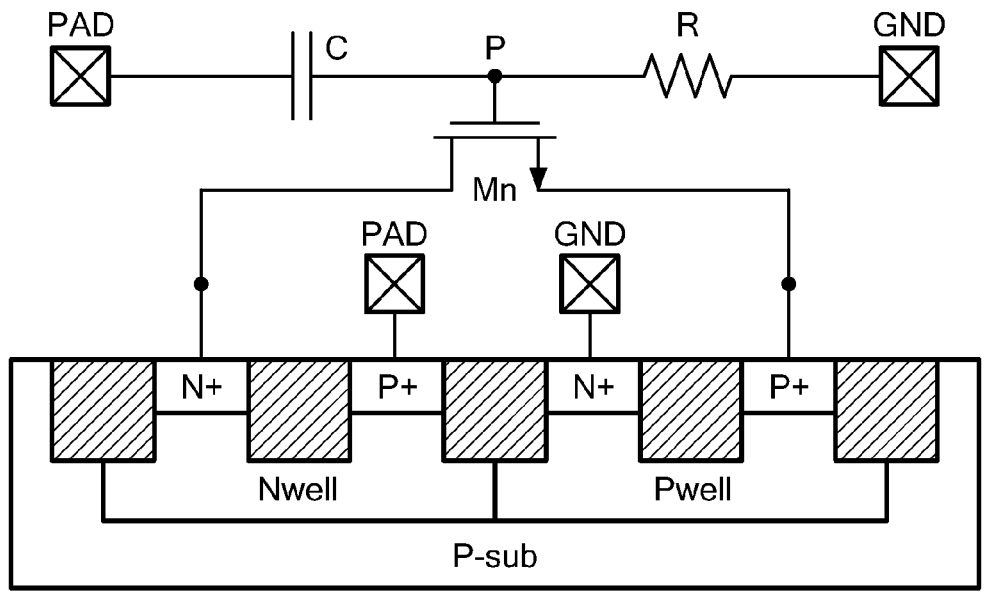
Figure 17A:
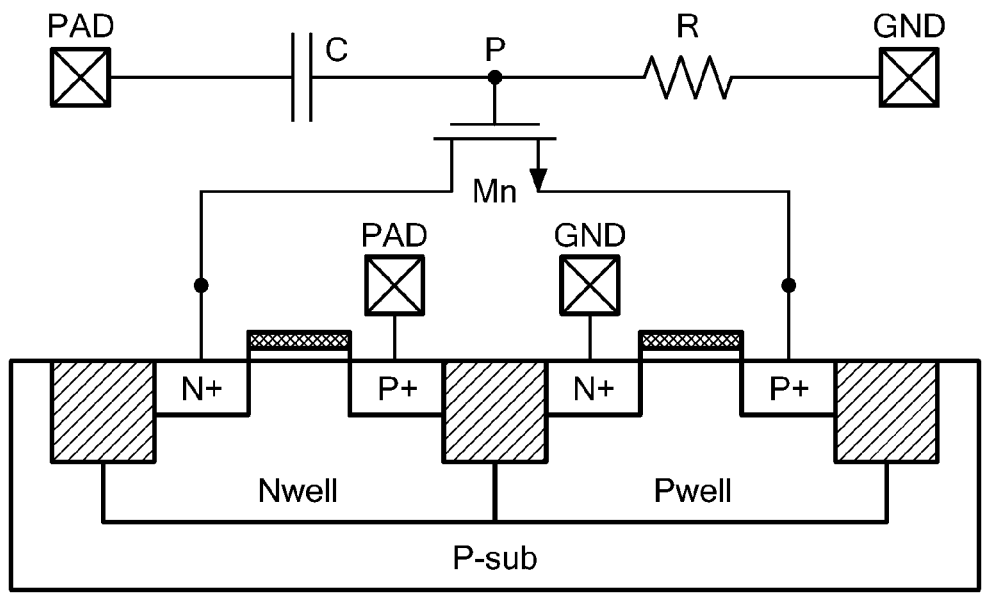
FIGS. 17A-C shows the MCSCR Type II with various dummy gate versions of disclosed DCSCRs.
Figure 17B:
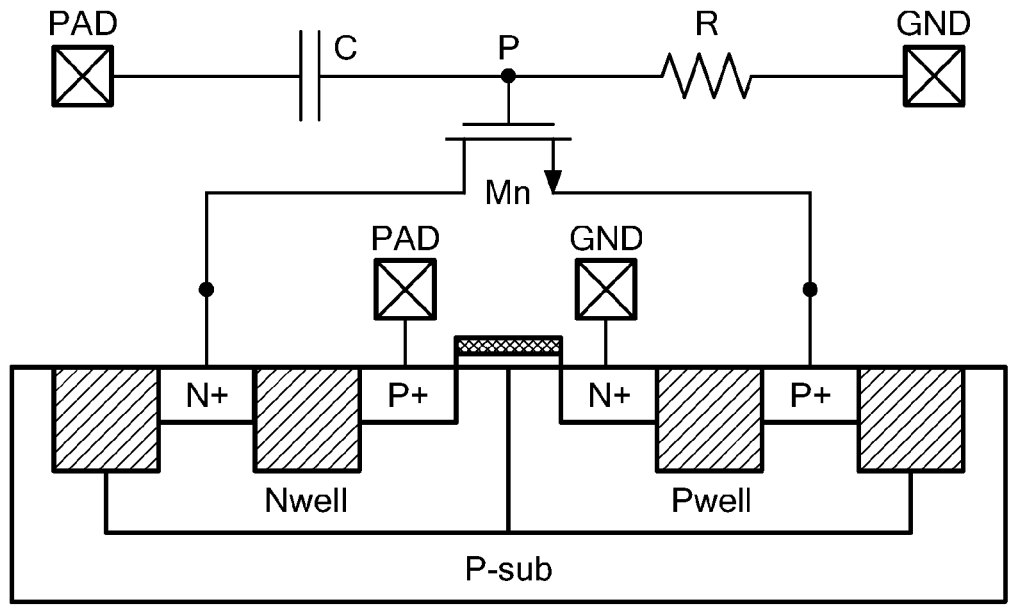
Figure 17C:
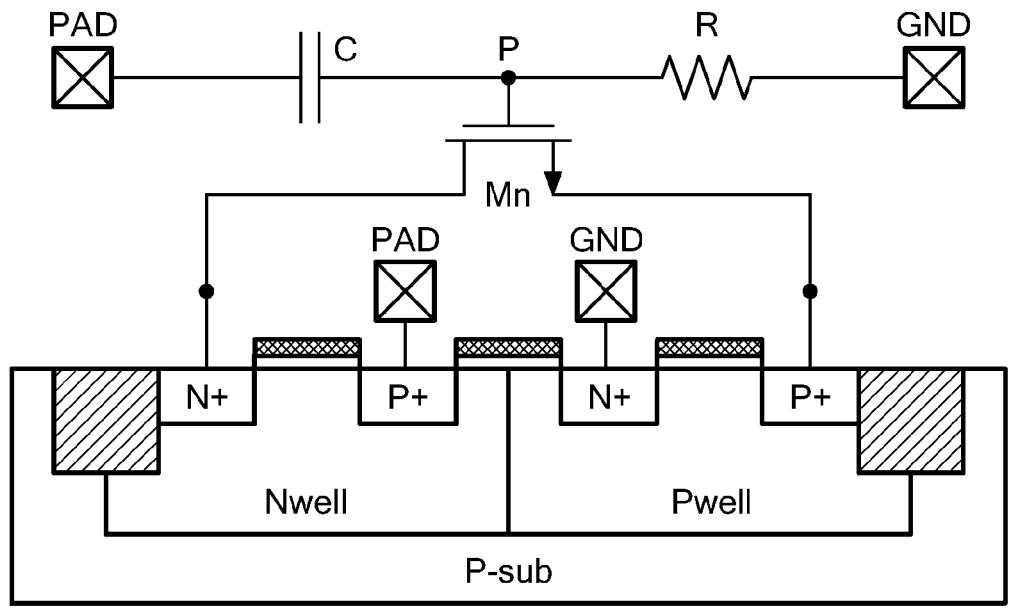

FIGS. 15 and 16 show a schematic and cross-section view, respectively, of Type II low-leakage and low trigger voltage structure (MCSCR Type II) ESD detector circuit. This ESD Detector Circuit includes an RC network which is coupled to an NMOS transistor. The operation of this structure is similar to the Type I ESD detector circuit described above. FIG. 17A-C shows the MCSCR Type II ESD detector circuit with various twin well dummy gate DCSCR versions.

Figure 18:
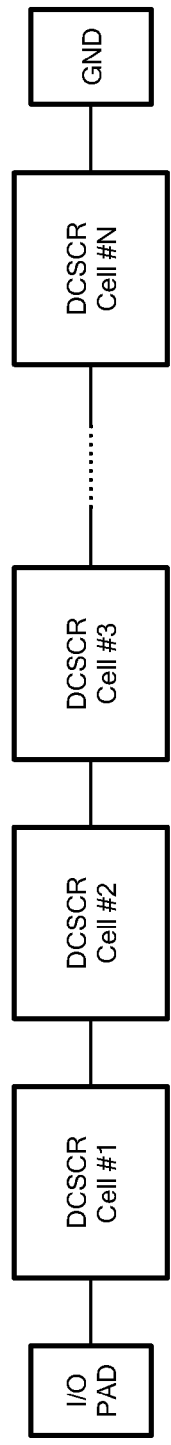
FIG. 18 shows a plurality of series connected disclosed DCSCR for applications in relatively high voltage technologies (Type I).

The above described DCSCR can also be used for ESD protection solutions for high voltage ICs. Two types of ESD clamps for high voltage ESD protection are disclosed. FIG. 18 shows a plurality (N) of series connected disclosed DCSCR for applications in relatively high voltage technologies (Type I). This approach stacks several DCSCR cells in series to achieve a desirable high trigger and high holding voltages. The stacking number depends on the required trigger voltage, or the ESD design window. Since a single DCSCR cell does not possess a snapback behavior, the stacking of multiple DCSCR cells also lacks snapback, thus providing an excellent ESD design window with adequate trigger and holding voltages for immunity of potential latch-up and core circuit damage. In order to realize this stacking arrangement, an n-type buried layer (NBL) or Deep N-Well (DNW) may be used to isolate the pwell from P-type substrate (P-sub).

Figure 19:
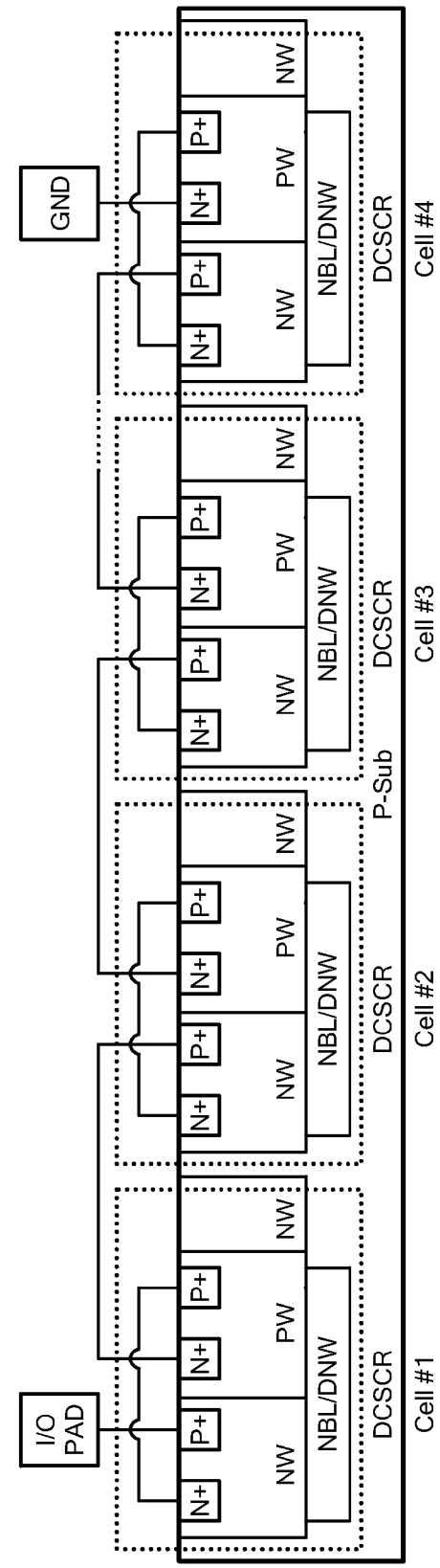
FIG. 19 shows a cross-section view of the series stacking of disclosed DCSCR cells for high voltage ESD applications.
Figure 20:
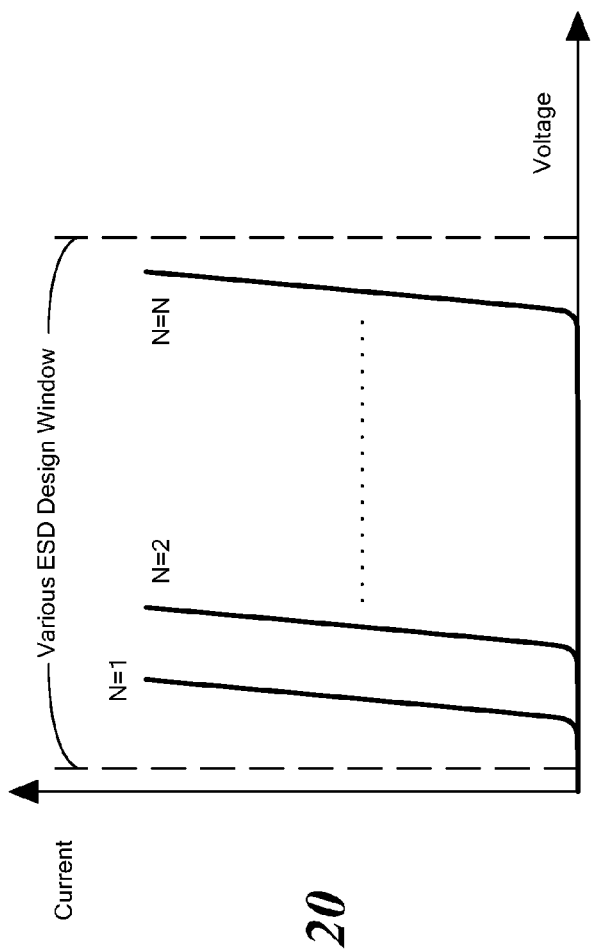
FIG. 20 shows the conceptual I-V characteristics of the series stacking device shown in FIG. 19, demonstrating that adjustable trigger and holding voltages can be designed by changing the stacking number N.

FIG. 19 shows a cross-section view of the series stacking of DCSCR cells for high voltage ESD applications with 4 DCSCR cells shown. FIG. 20 shows the conceptual I-V characteristics of the stacked device of FIG. 19, demonstrating that adjustable trigger and holding voltages can be designed by changing the stacking number N.

Figure 21:
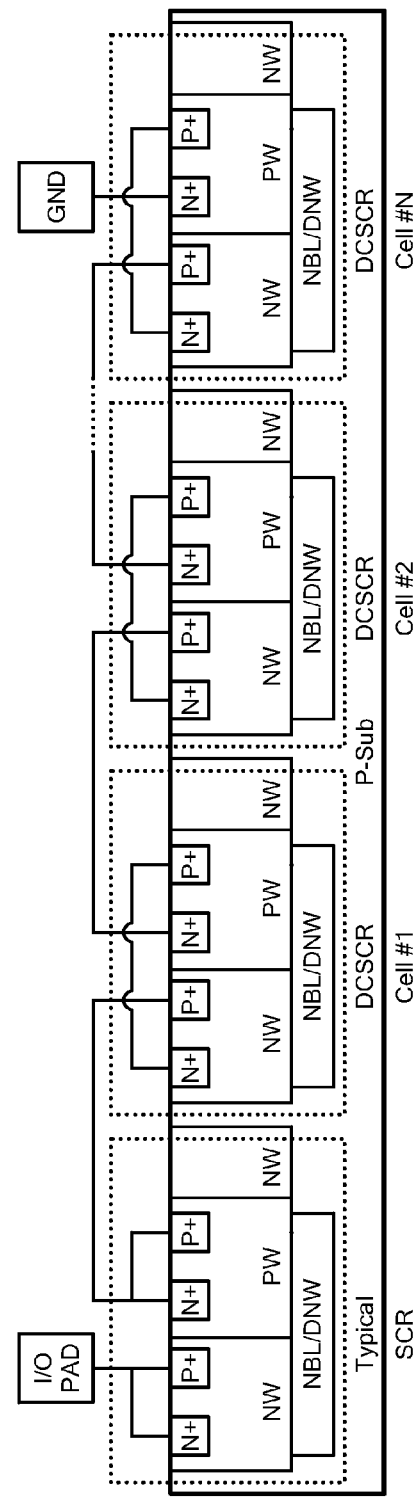
FIG. 21 shows a cross section view of a series stacked structure including a conventional SCR and some disclosed DCSCRs hooked in series.

If a large trigger voltage is needed and at the same time limiting the number of DCSCR cells is desirable, then the stacking structure can include a typical SCR in combination with several DCSCR in series). Such typical SCR will dominate the trigger voltage of the series stacked circuit. FIG. 21 shows a cross section view of a stacking structure including a conventional SCR and three disclosed DCSCRs hooked in series.

Defining the holding voltages of DCSCR and typical SCRs as $V_{H,novel}$ and $V_{H,typical}$ respectively, and the trigger voltages of DCSCR and typical SCRs as $V_{T1,novel}$ and $V_{T1,typical}$ respectively. N is defined as the number of DCSCR in the stacked ESD circuit. For a specific ESD design window, one can design the trigger and holding voltages according to the following condition so as to reduce or eliminate snapback behavior:

$$N\times V_{H,novel}+V_{H,typical}\geq N\times V_{T1,novel}+V_{T1,typical}$$

Figure 22:
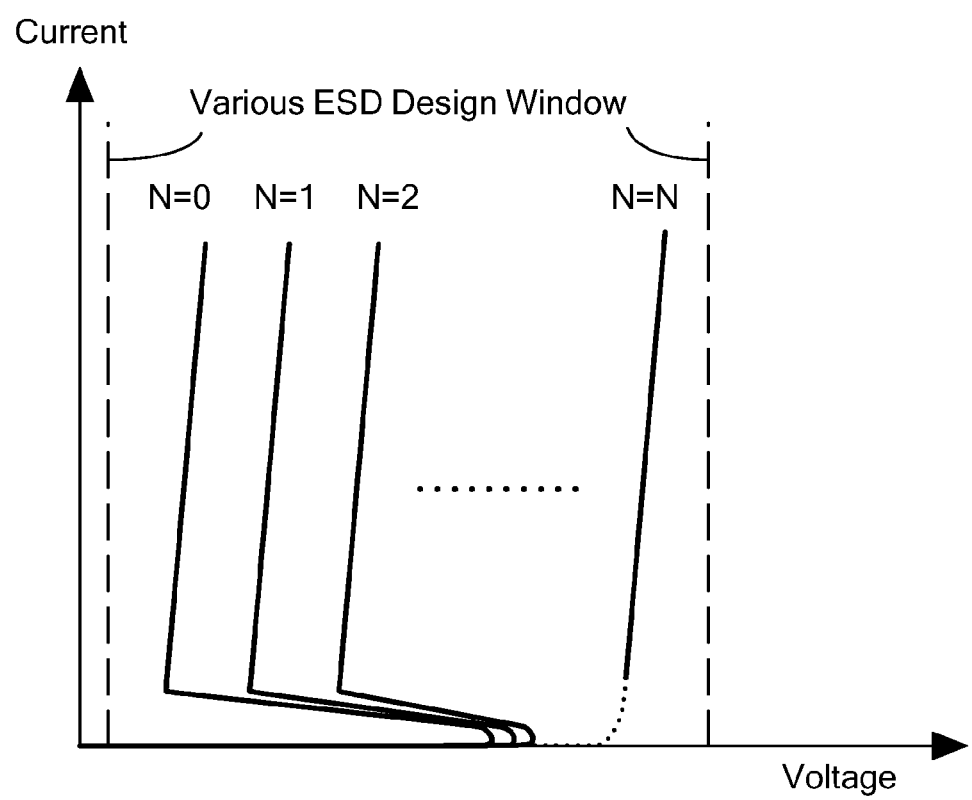
FIG. 22 shows conceptual I-V characteristics of the stacked structure of FIG. 21, demonstrating that adjustable trigger and holding voltages can be designed by changing the DCSCR cell number N.

FIG. 22 shows I-V characteristics of the stacked device of FIG. 21, demonstrating that adjustable trigger and holding voltages can be designed by changing the DCSCR cell number N (i.e., the case of N=0 indicates the structure includes 1 typical SCR or DCSCR and zero DCSCR, the case of N=1 consists of 1 typical or DCSCR and 1 DCSCR, etc.).

As described above, known SCRs have relatively high trigger voltage and leakage current, and process snapback behavior, which make it hard to work in small ESD design windows. Moreover known SCRs have slower turn-on speed which can be fatal to fast-rising ESD stress if the SCRs do not turn on in time to provide a current shunt. Disclosed DCSCRs in contrast provide a much lower trigger voltage (about two forward diode drops, or about 1.3V), non-snapback behavior and faster turn-on speed without extra semiconductor area because the triggering circuit can be all internal. Disclosed DCSCRs can thus be fit in various ESD design windows and provide effective ESD protection on chip in both low and high voltage semiconductor technologies, as well as next generation very-low voltage semiconductor technologies. Uses for disclosed DCSCRs include on-chip ESD protection (I/O or power clamp) for ICs for both low and high voltage semiconductor technologies, as well as next generation very-low voltage semiconductor technologies.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

The invention claimed is:

1. A direct connected silicon control rectifier (DCSCR), comprising:
    a substrate having a semiconductor surface;
    at least one n-well;
    a parasitic PNP bipolar transistor and parasitic NPN bipolar transistor formed in the semiconductor surface, the parasitic PNP bipolar transistor comprising a p+ emitter, an n-base and a p-collector;
    a parasitic NPN bipolar transistor formed in the semiconductor surface, the parasitic NPN bipolar comprising an n+ emitter, a p-base and an n-collector; and
    an electrically conductive line connecting an n+ contact of the n-base to a p+ contact of the p-base so that the n-base and the p-base are shorted,
    wherein the semiconductor surface is p-type and provides the p-base, and
    wherein the n-well provides the n-base.

2. The DCSCR of claim 1, further comprising functional circuitry formed in and on the semiconductor surface; wherein the DCSCR is hooked in parallel with at least a first sub-circuit of the functional circuitry between a input/output (I/O) bond pad and a ground pad of the functional circuitry.

3. The DCSCR of claim 1, wherein the DCSCR is coupled to an ESD detector circuit.

4. The DCSCR of claim 1, wherein the DCSCR is coupled to a plurality of other DCSCRs in series.

5. A twin-well direct connected silicon control rectifier (DCSCR), comprising:
    a substrate having a semiconductor surface;
    a parasitic PNP bipolar transistor formed in the semiconductor surface, the parasitic PNP bipolar transistor comprising a p+ emitter, an n-well providing an n-base and a p-well providing a p-collector;
    a parasitic NPN bipolar transistor formed in the semiconductor surface, the parasitic NPN bipolar comprising an n+ emitter, the p-well providing a p-base and the n-well providing an n-collector; and
    an electrically conductive line connecting an n+ contact of the n-well to a p+ contact of the p-well so that the n-base and the p-base are shorted.

6. The DCSCR of claim 5, wherein the DCSCR is coupled to an ESD detector circuit.

7. The DCSCR of claim 5, wherein the DCSCR is coupled to a plurality of other DCSCRs in series.

8. The DCSCR of claim 5, further comprising functional circuitry formed in and on the semiconductor surface; wherein the DCSCR is hooked in parallel with at least a first sub-circuit of the functional circuitry between a input/output (I/O) bond pad and a ground pad of the functional circuitry.

9. A direct connected silicon control rectifier (DCSCR), comprising:
    a substrate having a semiconductor surface;
    an n-well;
    a p-well;
    a parasitic PNP bipolar transistor formed in the semiconductor surface, the parasitic PNP bipolar transistor comprising a p+ emitter, an n-base and a p-collector;
    a parasitic NPN bipolar transistor formed in the semiconductor surface, the parasitic NPN bipolar comprising an n+ emitter, a p-base and an n-collector; and
    an electrically conductive line connecting an n+ contact of the n-base to a p+ contact of the p-base so that the n-base and the p-base are shorted,
    wherein the n-well provides the n-base and the p-well provides the p-base, and
    wherein the n+ emitter is not in direct contact with the electrically conductive line.

10. The DCSCR of claim 9, wherein the DCSCR is coupled to an ESD detector circuit.

11. The DCSCR of claim 9, wherein the DCSCR is coupled to a plurality of other DCSCRs in series.

* * * * *